United States Patent [19]
Di Zenzo et al.

[11] Patent Number: 5,798,962
[45] Date of Patent: Aug. 25, 1998

[54] MEMORY SCHEMES

[75] Inventors: Maurizio Di Zenzo, Roccapriora; Romano Casalini, Rieti, both of Italy

[73] Assignee: Texas Instruments Incorporated, Dallas, Tex.

[21] Appl. No.: 686,837

[22] Filed: Jul. 26, 1996

[51] Int. Cl.⁶ .................................................. G11C 5/02
[52] U.S. Cl. ........................................ 365/52; 365/200
[58] Field of Search .................... 365/51, 52, 63, 365/230.03, 200

[56] References Cited

U.S. PATENT DOCUMENTS 5,278,793   1/1994   Yeh ............................................ 365/200

Primary Examiner—David C. Nelms
Assistant Examiner—Hoai V. Ho
Attorney, Agent, or Firm—Gerald E. Laws; William B. Kempler; Richard L. Donaldson

[57] ABSTRACT

A memory module, such as a Single In Line Memory Module (SIMM), is provided which utilizes defective, substandard and/or unconventional memory devices to provide functionality that is equivalent to a memory module constructed with fully operational standard memory devices.

12 Claims, 4 Drawing Sheets

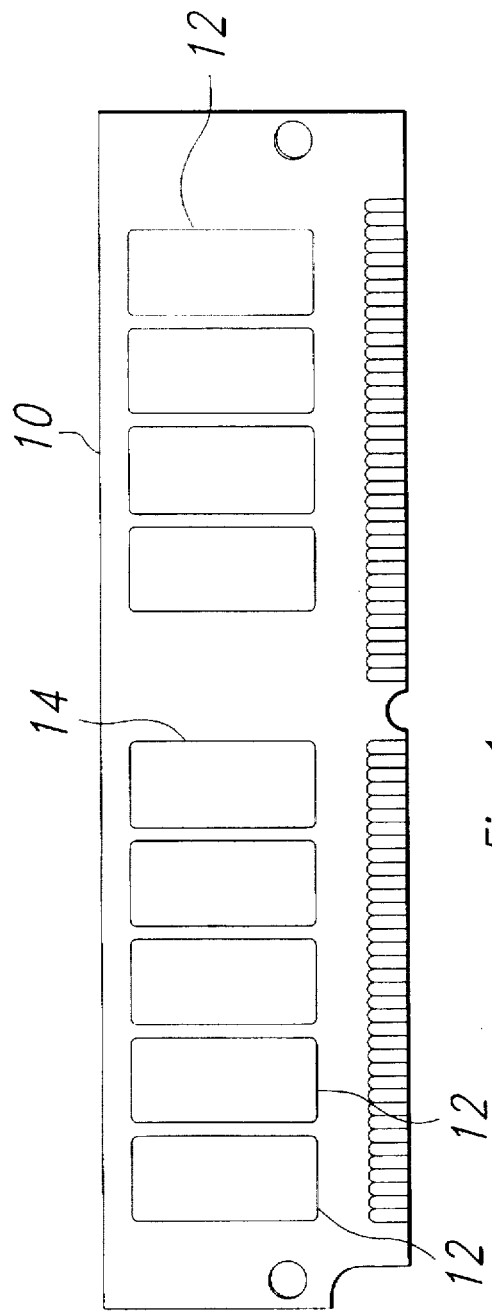
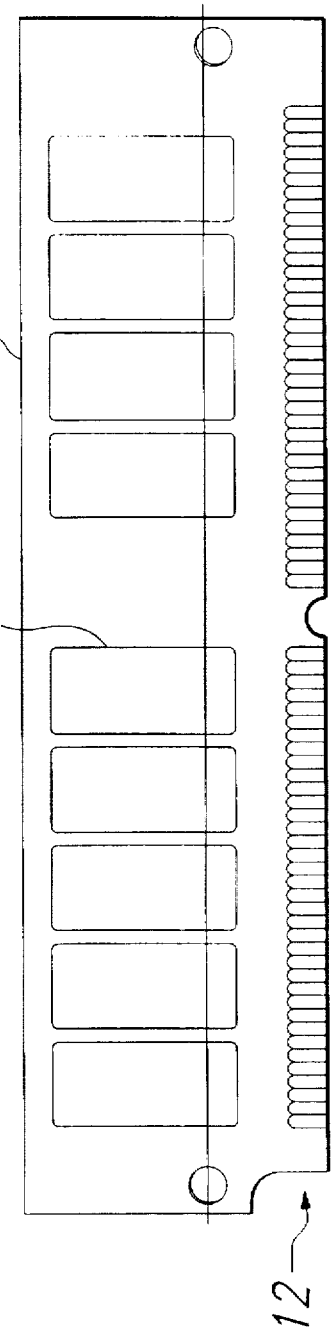

MEMORY SCHEMES

FIELD OF THE INVENTION

This invention relates to improvements in memory schemes particularly to Single in Line Memory Modules (SIMMS) which is an industry standard module.

BACKGROUND OF INVENTION

A SIMM may be used in a large number of applications and is typically produced having a number of Dynamic Read Access Memory (DRAM) modules mounted on a Printed Circuit Board (PCB).

In the past a SIMM (10) has been produced which includes both DRAM memories (12) and a parity memory (14) as shown in FIG. 1. The solution has been used in the past in applications which require a parity bit which could not be provided by the DRAM cells. The parity bit is an extra bit over and above the other bits provided by the DRAM cells and are often needed in applications such as large memories in work stations.

Use of this type of SIMM allows detection of single errors by an external memory controller. This scheme is becoming unpopular and the trend is towards DRAM only SIMMS, due in part at least to the improvements which have been made in the quality of DRAMS.

Accordingly parity memories which have been made are now going to waste. In addition, it is not uncommon for a batch of DRAMS to contain a percentage of devices which are not fully operational and include one or more deflects. The nature and extent of the defects are typically identified, when the device undergoes testing. This results in a large number of devices having known defects being disgarded.

SUMMARY OF THE INVENTION

It is proposed by this invention that the functionality provided by a DRAM in a SIMM can be provided by other types of memories or in fact DRAMS which are damaged or working at below optimum operating conditions, for example a below optimum operating speed.

According to one aspect of the present invention, there is provided a memory module having a required predetermined functionality comprising a plurality of defective, substandard and/or un-conventional memory devices arranged to produce said predetermined functionality.

This has the advantages that a SIMM can be produced with any combination of available memories which when combined form the required SIMM functionality.

Preferably the memory module includes control logic which is able to control the memory devices to have the predetermined functionality.

Preferably the required predetermined functionality is based on a memory module having a predetermined number of standard DRAM devices.

Advantageously the plurality of memory devices include parity memories; defective DRAM memories and DRAM memories having below optimum operating parameters.

Preferably the memory module further comprising a printed circuit board (PCB) on to which the memory devices are mounted and in one embodiment of the invention the memory devices are mounted on both sides of the PCB.

According to a second aspect of the invention there is provided a memory cell having a standard operating functionality comprising a plurality of defective, substandard and/or un-conventional memory devices arrange such that the standard operating functionality is obtained.

BRIEF DESCRIPTION OF THE DRAWINGS

Reference will now be made, by way of example, to the accompanying drawings, in which:

FIG. 1 is a schematic diagram of a prior art SIMM;

FIG. 2 is a schematic diagram of the top surface of a SIMM in accordance with an embodiment of the invention;

DETAILED DESCRIPTION

Referring to FIG. 2 a SIMM is illustrated which includes a plurality of memory devices (18) mounted on a Printed Circuit Board (PCB) (16). The top surface (20) of the PCB includes eight memory devices of the type or types described below. There may be an equivalent number of memory devices on the underside of the PCB (not shown) in certain applications which will be described in greater detail below.

Figure 3:
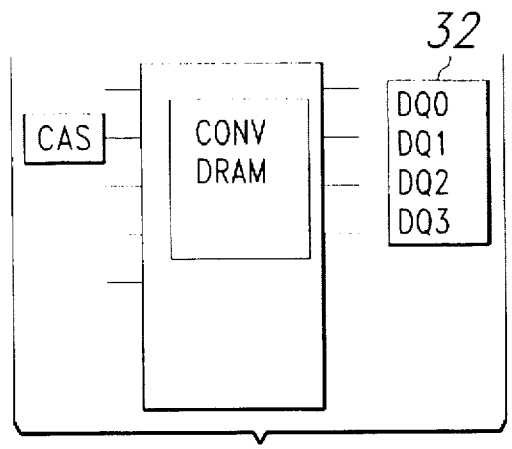
FIG. 3 is a schematic diagram of a conventional DRAM for use in a SIMM.

Referring to FIG. 3 a DRAM (30) is illustrated with only some of its inputs/outputs (I/O's) showing. In particular it can be seen that the DRAM produces four DQ outputs (32). The DRAM is organised in words of four bits each, each bit is controlled by a dedicated Column Address Strobe (CAS).

Built in this chip is the capability to utilise partial working units, more specifically chips that do not exhibit failures on any combination of two I/O's at least; these two I/O's at laser repair level, can be always mapped on chip pins DQ0 and DQ1 each I/O is controller by a dedicated CAS line; these chips are known as Dual-CAS and their capacity is half of the original chip.

Figure 4:
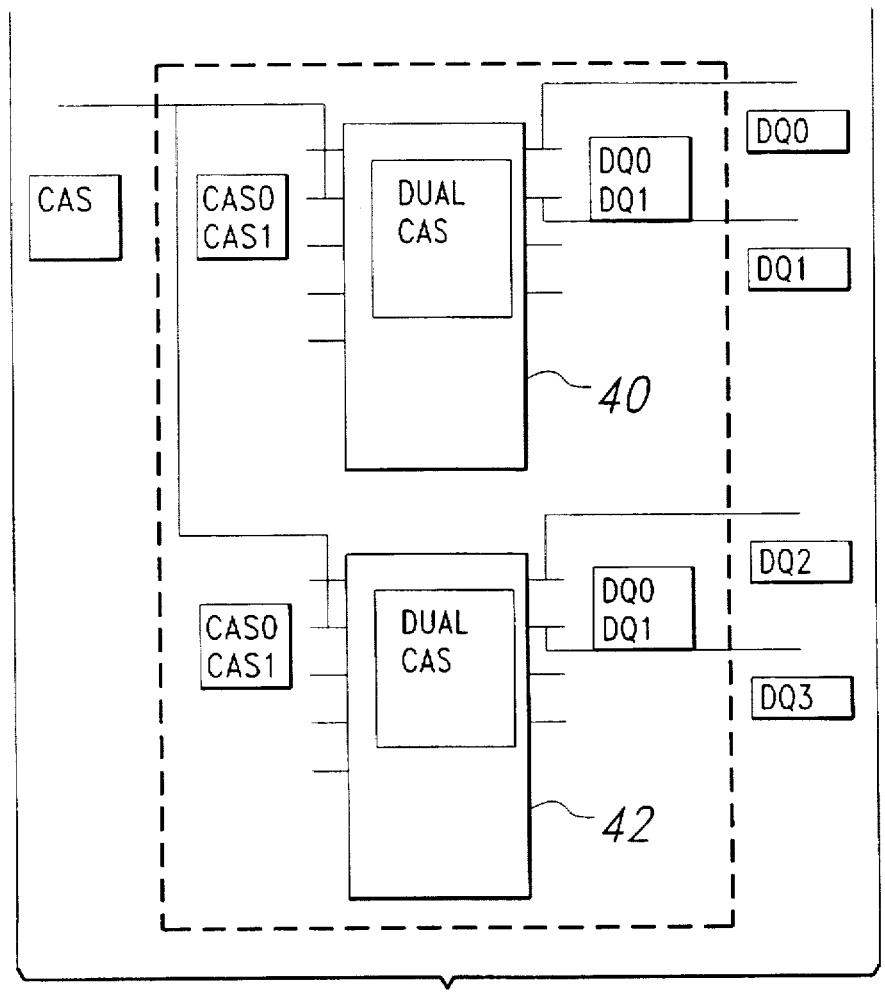
FIG. 4 is a schematic diagram of the present invention of a memory cell having the same functionality as the memory of FIG. 3.

Using the configuration in FIG. 4 it is possible to implement a functionality equivalent to the chip of FIG. 3. Two parity or Dual-CAS chips (40, 42) are used. Each chip (40, 42) is controlled by Address Strobes CAS0, CAS1 generated by a conventional CAS signal and each produces two outputs DQ0, DQ1 and DQ2, DQ3 respectively.

The PCB is formed in a specific manner such that it connects all the CAS lines together and connects the two only functional DQ's to the proper SIMM DQ in order to emulate a conventional SIMM.

Moreover a conventional SIMM with parity check is usually required to have an access time of <70 nS, therefore QUAD-CAS chips that do not operate within the required speed limitation cannot normally be used in an SIMM.

It is possible to utilise Quad-CAS chips on the same PCB as well, the four CAS lines will be connected together, but no specific care will be used for the DQ lines, that are compatible with standard DRAM's.

Figure 5:
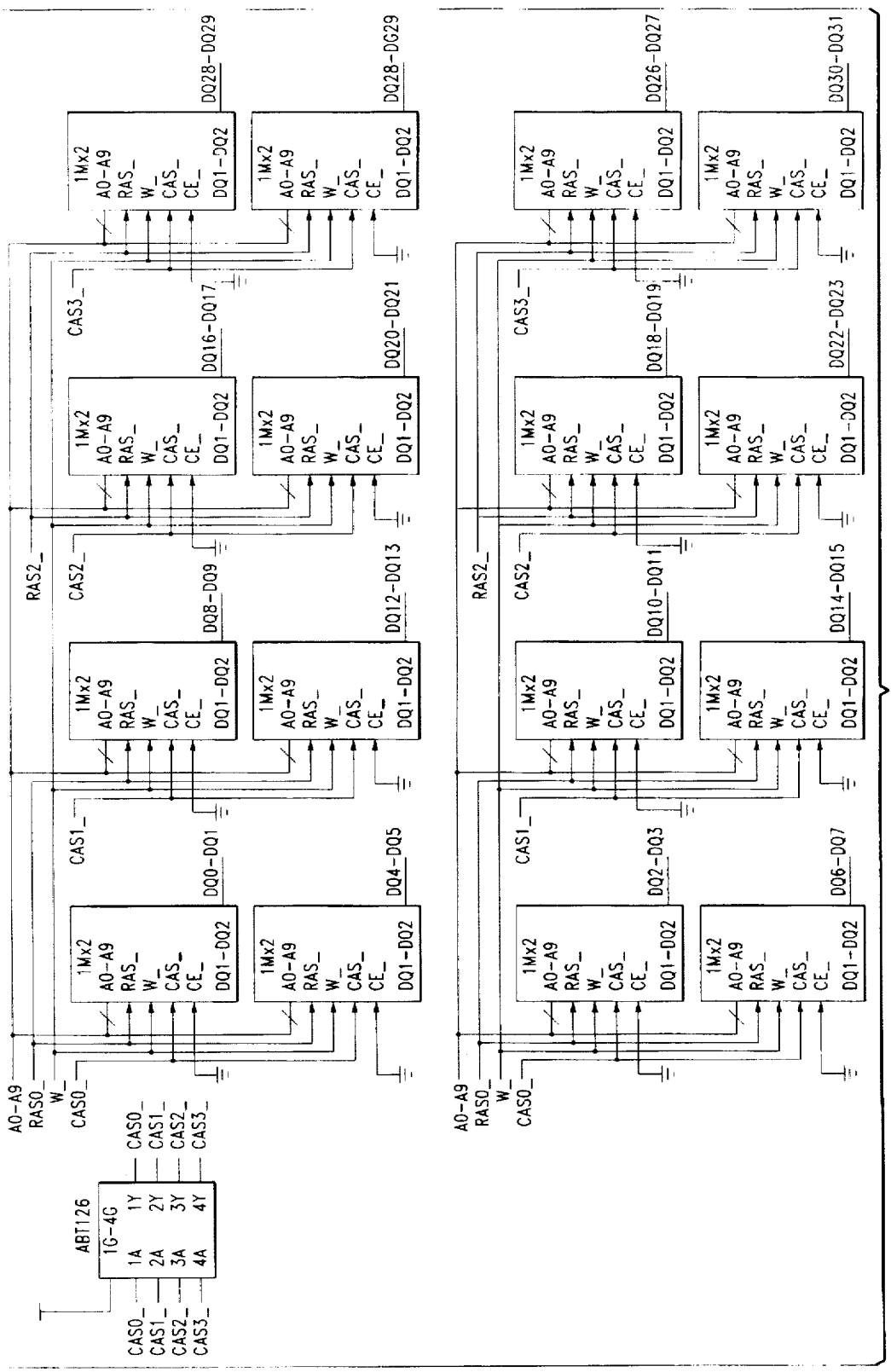
FIG. 5 is a schematic diagram of a SIMM according to an embodiment of the invention.
Figure 6:
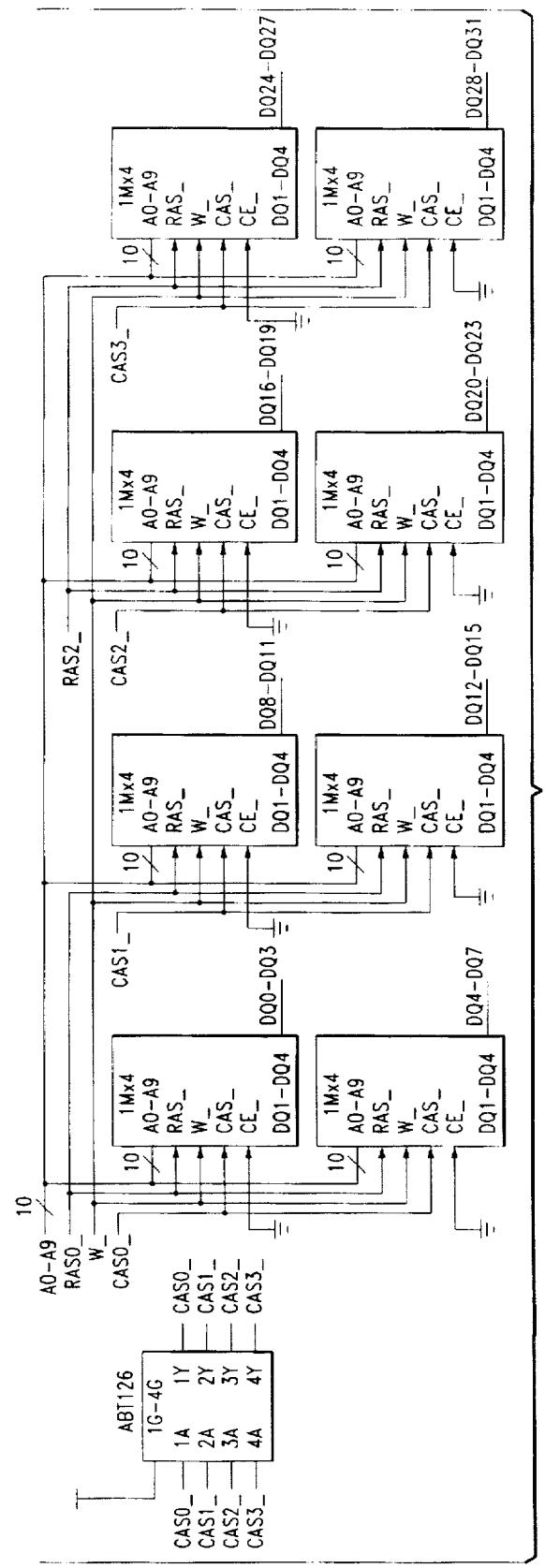
FIG. 6 is a schematic diagram of a second SIMM according to another embodiment of the invention.

The total capacity that can be implemented, taking into account the mechanical limitation of the SIMM, is 1M words of thirty two bits each; using Dual-CAS chips sixteen units (50) will be mounted on both sides of the PCB as is shown in FIG. 5. Each memory unit will produce two outputs and be supplied with the necessary control signals as are shown in the figure. The Dual-CAS chips may be replaced by other non-standard memory cells having equivalent functionality for example a defective standard DRAM having only two of the possible four outputs operational. Using Quad-CAS only eight chips (60) will be used, populating only one side of the SIMM as show in FIG. 6. Again these chips can be replaced with others having equivalent functionality e.g. a defective eight bit DRAM which only has four valid outputs.

In the case of chips which do not operate within the required speed limitation it is possible to use two such chips and access only two of the outputs of each chip. This enables an improvement in the access time of the two chips and replaces the functionality of a conventional DRAM.

It will be appreciated that for different combinations of memory cell different wiring and control systems may be required for dealing with different problems and memory requirements.

We claim:

1. A memory module having a predetermined functionality, comprising:

a plurality of data bit output contacts;

a plurality of defective, substandard and/or unconventional memory chips each having a plurality of data bit output pins that are connected to corresponding data bit output contacts of the plurality of data bit output contacts; and wherein at least a first one of the plurality of data bit output pins on each of the plurality of memory chips is connected to a respective data bit output contact and at least a second one of the plurality of data bit output pins on each of the plurality of memory chips is not connected to a data bit output contact.

2. The memory module of claim 1, further comprising control logic which is able to control the memory devices such that they have the predetermined functionality.

3. The memory module of claim 1 wherein the required predetermined functionality is based on a memory module having a predetermined number of standard DRAM chips.

4. The memory module of claim 1 wherein the plurality of memory chips include parity memories.

5. The memory module of claim 1 wherein the plurality of memory chips include defective DRAM memories.

6. The memory module of claim 1 wherein the plurality of memory chips include DRAM memories having below optimum operating parameters.

7. The memory module of claim 1 further comprising a Printed Circuit board (PCB) on to which the memory chips are mounted.

8. The memory module of claim 7, wherein the memory chips are mounted on both sides of the PCB.

9. The memory module of claim 1, wherein the module is in the form of a Single In Line Memory Module (SIMM).

10. The memory module of claim 1, wherein:

a first defective memory chip of the plurality of defective memory chips has a first plurality of data bit output pins which are provided for a corresponding plurality of data bits, wherein at least a first one of the data bits is defective; and wherein the defective memory chip is repaired by disconnecting the defective first data bit from the corresponding first one of the plurality of data bit output pins and connecting the first one of the plurality of data bit output pins to a non-defective one of the plurality of data bits, whereby an entire portion of the defective memory chip is ignored.

11. The memory module of claim 10, further comprising a Printed Circuit board (PCB) on to which the memory chips are mounted and onto which the plurality of data bit output contacts are affixed, such that a same first one of the plurality of data bit output pins on each of the plurality of defective memory chips is connected to a respective one of the plurality of data bit output contacts; and wherein a same second one of the plurality of data bit output pins on each of the plurality of defective memory chips is not connected to a data bit output contact.

12. A defective memory chip, comprising:

a plurality of data bits, wherein at least a first one of the plurality of data bits is defective;

a plurality of data bit output pins which are provided for the corresponding plurality of data bits; and wherein the defective memory chip is repaired by disconnecting the defective first data bit from the corresponding first one of the plurality of data bit output pins and connecting the first one of the plurality of data bit output pins to a non-defective one of the plurality of data bits.

* * * * *